United States Patent [19]
Wermuth

[11] 3,969,680
[45] July 13, 1976

[54] AUTOMATIC DYNAMIC COMPANDER SYSTEM

[75] Inventor: Jürgen Wermuth, Stederdorf, Germany

[73] Assignee: Licentia Patent-Verwaltungs-G.m.b.H., Frankfurt am Main, Germany

[22] Filed: Jan. 24, 1975

[21] Appl. No.: 543,931

[30] Foreign Application Priority Data
Jan. 26, 1974 Germany.......................... 2403799
Feb. 9, 1974 Germany.......................... 2406258

[52] U.S. Cl. ................................ 330/29; 179/1 P; 330/85; 330/136; 333/14
[51] Int. Cl.² ......................................... H03G 7/00
[58] Field of Search ............... 333/14; 325/65, 473, 325/477; 179/1 P; 323/19, 22 R; 330/85, 86, 109, 144, 145, 29, 136

[56] References Cited
UNITED STATES PATENTS
3,496,468   2/1970   Kaneko et al..................... 333/14 X
3,720,880   3/1973   Le Seigneur........................ 330/29
3,795,876   3/1974   Takahashi et al..................... 333/14

*Primary Examiner*—Paul L. Gensler
*Attorney, Agent, or Firm*—Spencer & Kaye

[57] ABSTRACT

In a circuit for the automatic dynamic compression or expansion of a signal between its input and its output, the circuit presenting a useful signal path connected between its input and its output and containing a setting member which is electronically controllable for varying the transmission factor between the circuit input and output, the circuit also presenting a branch path connected at one point to the useful signal path and containing a control voltage generator for generating, from the signal in the useful signal path, a control voltage applied to control the setting member, there is also provided a second setting member connected in the branch path and arranged to be electronically controllable for varying the transmission factor exhibited by the branch path, and means connecting the output of the control voltage generator to the second setting member for effecting a counter-regulation of the transmission factor of the branch path, relative to the transmission factor variation imparted to the useful signal path.

9 Claims, 13 Drawing Figures

(COMPRESSION)

(EXPANSION)

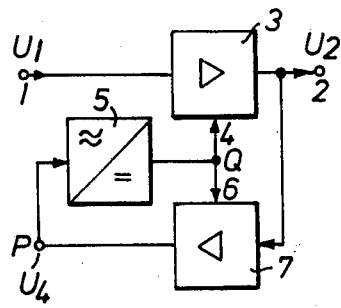
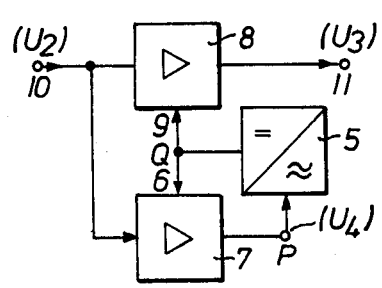
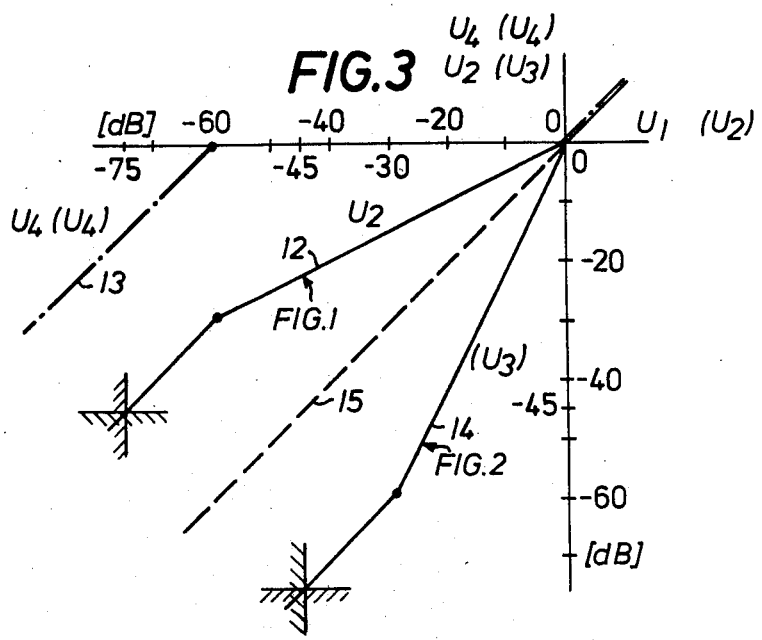
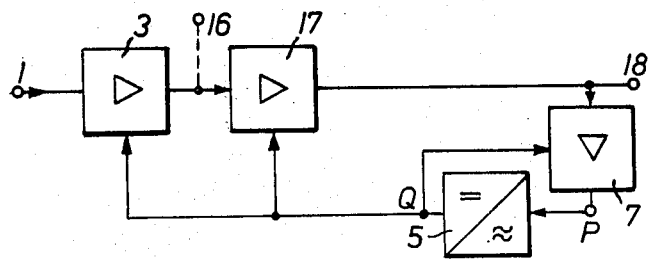

AUTOMATIC DYNAMIC COMPANDER SYSTEM

BACKGROUND OF THE INVENTION

The present invention relates to automatic dynamic compression/expansion systems, particularly for use in high fidelity sound reproduction equipment.

It is known that the quality of the reproduction of audio frequency performances can be improved by increasing the signal to noise ratio by means of a compression-expansion system known as a compander system, in which the useful signals are compressed in amplitude before they enter a transmission path susceptible to interference, e.g. a line or a recording tape, and are expanded after transmission.

In known systems there is the goal of meeting, inter alia, the following requirements to the maximum extent possible: low cost, corresponding characteristics during compression and expansion, good reproducibility of the required values in instruments of, for example, a mass-fabricated series, and the expandability of the system concept with respect to the selection of the degree of expansion and compression. The known compression-expansion systems are either relatively complicated and produce good quality or they are less expensive — - as required for instruments sold to the general public — and do not meet the above requirements to a satisfactory degree.

SUMMARY OF THE INVENTION

It is an object of the present invention to provide a circuit for a compression-expansion system which makes it possible, with comparably low expenditures, to obtain good quality with respect to the desired correspondance between the compression and expansion characteristics, low temperature dependence, good reproducibility of the desired values in instruments of one or a plurality of mass-produced series without requiring the extra work of matching, and an enlargement of the system toward very high degrees of compression and expansion.

The present invention relates to a circuit for the automatic dynamic compression or expansion in a useful signal path with a setting member, or variable gain member, for varying the transmission factor, and in which a branch exists from the output or input, of the useful signal path. In this branch a control voltage is produced from the useful signal in a control voltage generator and is fed to the setting member in the useful signal path. According to the invention the control voltage is also fed to a setting member, or variable gain member, disposed in the branch path for the purpose of effecting a counter regulation of the transmission factor in the branch path.

The transmission factor may be the gain or the damping factor so that the gain of each variable gain member can be, in terms of output/input, greater or less than 1 or in terms of dB, either positive or negative.

The transmission factor can also be varied by known setting members, for example with direct regulation of the gain of amplifiers or by a change in the feedback or coupling in of amplifiers or by controlling passive components.

The counterregulation according to the present invention enables the control characteristics for the compression and expansion, which will be referred to hereinafter as characteristics, to initially be approximately linear so that their reproducibility in the instruments of a mass-produced series, for example, is facilitated. The normal deviations in the properties of the individual components here have no significant influence. In the simplest case, the control voltage generator may be a conventional rectifier circuit with threshold value, e.g. a diode circuit with a biased diode, so that for slow changes in amplitude the resulting direct control voltage follows the amplitude of the useful signal.

The linearization of the characteristics is improved, according to an important embodiment of the invention, in that the means disposed in the useful signal path for varying the degree transmission factor and the means disposed in the branch path for varying the transmission factor have the same or complementary dependence on the change in the control voltage. The meaning of complementary dependence is a contrary dependence at expansion in view of the dependence at compression.

The complementary dependence applies to the case of expansion but is not there required if the polarity of the control voltage is reversed for the expansion. The same or a complementary dependence also has a favorable influence on the constancy of the slope of the characteristics for compression and expansion which is important for the reproducibility of the characteristics and thus simplifies fabrication. Actually, the above-mentioned equality of the dependencies would not be absolutely required to improve linearization and achieve a constant slope because this would also be attained if the dependencies would differ from one another by a constant factor. Since this is possible only at high cost, such as by connecting a plurality of setting members in series or parallel, it is preferable to select identical dependencies.

According to a further important embodiment of the invention, the constancy of the slope of the linearized characteristics is further improved by designing the control generator in such a manner that when the useful signal, and thus also the input signal to the generator, exceeds a threshold value, there is produced a direct control voltage which increases or decreases rapidly from a threshold value independently of the value of the useful signal until the transmission facor in the branch path has been reduced to such an extent that the input signal to the control voltage generator, and thus in the case of dynamic compression the output signal in the useful signal path, drops below the threshold value, so that the control voltage either decreases gradually to its quiescent value or increases again in which case the process recommences. Preferably, the control voltage generator includes a capacitor which is discharged or charged via an electronic switch which becomes conductive above the threshold value and which is influenced by the useful signal, thus producing the control voltage, while charging and discharging are effected from the operating voltage via a resistor.

When such a control voltage generator is employed there results the additional advantage that the transition between the lower and the center portion of the characteristics has a sharp and thus easily reproducible bend. In a control voltage generator designed according to this principle there appears at the input of the control voltage generator a constant alternating voltage, at the level of the above-mentioned threshold voltage, over the entire control range. This results in a completely constant slope of the characteristics under the above-mentioned simplified conditions so that the characteristics constitute means for varying the transmission factor in the useful signal path and in the branch path to the same degree, or to a complementary degree.

The dynamic control employed in the known Dolby system, disclosed in German Offenlegungsschrift [Laid-Open Patent Application] No. 1,487,276, in a branch channel which has been branched off from the useful signal is not required in a present invention because the dynamic control characteristics can be precisely duplicated from instrument to instrument. It is for this reason that the present invention is intended mainly for the undivided useful signal path, i.e. without the use of a branch channel for the useful signal. In this case, according to a further embodiment of the invention, the low amplitudes must be increased relative to the high amplitudes in the single, i.e. undivided, useful signal path. To prevent increasing the high amplitudes the control voltage or the effect of the setting member in the useful signal path is limited to a certain value.

It is also known to avoid the so-called breathing noise by dividing the useful frequency range into a plurality of partial ranges in which the dynamic controls take place independently of one another. This measure is advantageously employed together with the present invention.

The optimum effect of the present invention is obtained with a circuit having the form described above and in which the useful frequency range is subdivided by means of filters, the dynamic compressions and expansions are effected in the useful signal path independently of one another in the partial frequency ranges, and during dynamic compressions the low amplitude are increased relative to the high amplitudes by limiting the control voltage or the effect of the setting means for the useful signal path fo a certain value.

BRIEF DESCRIPTION OF THE DRAWINGS

FIG. 1 is a block circuit diagram of a compression circuit according to the present invention.

FIG. 2 is a block circuit diagram of an expansion circuit according to the present invention.

FIG. 3 shows the family of characteristics for the circuit according to the present invention.

FIG. 4 is a block circuit diagram of a further compression circuit according to the present invention.

DESCRIPTION OF THE PREFERRED EMBODIMENT

Figure 5:
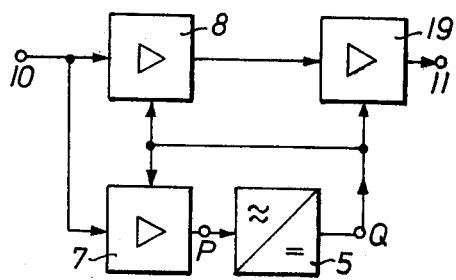
FIGS. 5 and 6 are block circuit diagrams of further expansion circuits according to the present invention.

FIG. 1 is a block circuit diagram showing a circuit according to the present invention for the compression of alternating voltage signals. Such a circuit can be employed, for example, during tape recording of such signals.

It is intended to convert the initial input signals $U_1$, which are present at input terminal 1 and which have a certain dynamic, i.e. amplitude, range, to signals $U_2$, which are present at the output terminal 2 and which have a smaller dynamic range. For this purpose, a variable gain amplifier 3 is disposed in the useful signal path between terminals 1 and 2. Amplifier 3 has a control input 4 via which its gain can be varied by means of a direct control voltage in order to vary the transmission factor, or gain.

To produce the direct control voltage, a branch path is provided which includes a further amplifier 7 provided with an input which is connected to the output of amplifier 3. The output of amplifier 7 feeds a control voltage generator 5 which serves to produce a direct voltage at point Q with a value dependent on the amplitude of the alternating voltage at its input. This voltage at point Q is fed to the control inputs 4 and 6 of amplifiers 3 and 7 as their control voltage.

The above-described circuit reduces the dynamic range of the useful signal because as the output voltage from amplifier 3 increases, the direct control voltage from generator 5 increases so as to effect a reduction in the gain of amplifier 3. Moreover, according to the present invention, the gain of amplifier 7 is then also reduced so that a counter regulation takes place in the branch path and this makes the control characteristic of the compression circuit of FIG. 1 almost linear. The control voltage at point Q in FIG. 1 is thus a regulating voltage. This effect will be explained in greater detail below in connection with FIG. 3.

FIG. 2 shows the use of the circuit of the present invention for the expansion of alternating voltage signals. Such a circuit serves, for example, to expand the signals which had been compressed from level $U_1$ to level $U_2$ by the circuit of FIG. 1 so that the output signals $U_3$ again have the dynamic range of the input signals $U_1$ of the circuit of FIG. 1.

The expansion circuit of FIG. 2 includes a variable gain amplifier 8 between the circuit input terminal 10 and the circuit output terminal 11. The branch path, which in this case has its input connected to the input instead of the output of amplifier 8 in the useful signal path, includes a variable gain amplifier 7 identical with that shown in FIG. 1. The control input 9 to amplifier 8 and the control input 6 to amplifier 7 are fed by the output Q of a control voltage generator 5 identical with that of FIG. 1.

To effect the desired expansion, amplifier 8 is designed so that the slope of its control characteristic has the opposite sign from the of the slope control characteristic of amplifier 3 while amplifier 7 of FIG. 2 coincides with amplifier 7 of FIG. 1 and is countercontrolled in the same manner.

If the input voltage ($U_2$) increases, the amount of the direct control voltage at control inputs 9 and 6 also increases and this has the result that the gain of amplifier 8 is increased while the gain of amplifier 7 is reduced.

This can also be achieved by disposing a phase reversal circuit for the direct control voltage between the control voltage generator 5 and one of amplifiers 7 and 8 and by constructing amplifiers 7 and 8 to be identical. Identically designed amplifiers can also be used if the amplification is determined by the feedback voltage divider as shown for example, in FIG. 7. The direct control voltage which is the same for both amplifiers then controls in a known manner as disclosed in German Offenlegungsschrift [Laid-Open Patent Application] No. 2,218,823, the one voltage divider resistor for compression and the other voltage divider resistor for expansion.

FIG. 3 presents a common type of signal level diagram. The useful signals $U_1$ to be processed for compression are represented along the abscissa between −75 dB (the assumed threshold of the noise of the source) and the rated level of 0 dB. The absolute value of the input voltage rises along the abscissa from the left toward the right up to the rated level.

The output levels $U_2$ for compression or the input level ($U_2$), indicated along the ordinate, for expansion lie between −45 dB and 0 dB. The absolute value of the output voltage rises along the ordinate, from the bottom to the top, up to the rated level. With accurate expansion, the output signals ($U_3$) also come to lie between the above-mentioned values of −75 dB and 0 dB.

Curve 12 represents the relation between the output level $U_2$ and input level $U_1$, and thus represents the characteristic of the compression circuit of FIG. 1. Between −75 dB and −60 dB for $U_1$ there is a constant gain of 30 dB, the slope of the characteristic 12 is 45°, so with that the same assumed maximum gain in amplifiers 3 and 7 of FIG. 1, an amplification of 60 dB with respect to point 1 is present at point P. Only when the input level $U_1$ rises to −60 dB, corresponding to the bend of the characteristic 12, which due to the gain of 60 dB corresponds to a level of $U_4 = 0$ dB at point P, will the control effect, i.e. compression, begin in the illustrated embodiment because then the threshold of the control voltage generator 5 begins to be exceeded. Beginning with $U_1 = -60$ dB, the gain of amplifier 3 continues to decrease and at an input level of 0 dB it has the value of 0 dB, i.e. a gain of 1. Above dB the curve 12 continues with the gain value 1, i.e. it constitutes a continuation of the dashed line 15 representing a gain of 1. It can be seen that the dynamic range of the input signals $U_1$ between −75 dB and 0 dB has been reduced to a range between −45 dB and 0 dB for the output signals $U_2$.

Curve 13 represents the path of voltage $U_4$ at point P, relative to $U_1$. Between −60 dB and 0 dB it is exactly horizontal if use is made of the above-mentioned improved control voltage generator, embodiments of which are shown in FIGS. 10 to 13. When a conventional control voltage generator with diode rectification is employed, the characteristic gradually rises the alternating voltage at point P in FIG. 1 increases somewhat with increasing useful signal voltage due to the control process in the branch path. This characteristic is curved and its curvature depends on the tolerance of the diode. This curvature is transferred, in a weakened manner, to the characteristics 12 and 14, thus correspondingly interfering with their linearity.

In the described case the expansion takes place in a manner corresponding to the compression. The characteristic required for this purpose is shown at 14. In this case the input signals ($U_2$) represented along the abscissa of FIG. 3, lie between −45 dB (compressed noise threshold) and 0 dB, the change in amplification beginning at ($U_2$) = −30 dB, at the point of the bend in curve 14. From these input levels, the original dynamic range of from −75 dB to 0 dB is obtained via characteristic 14 of the expansion circuit. Curve 13 for ($U_4$) shows the path of voltage ($U_4$) at point P, the statements made above regarding the characteristic being equally applicable here.

The significant advantage of the present invention lies in that the center section of the characteristics 12 and 14, which is decisive for the control, is practically linear due to the counterregulation according to the invention. The linear configuration indicates that the characteristics will also coincide in different instruments.

For an individual instrument it does not matter actually which path the characteristic takes as long as the compression and expansion paths correspond. Difficulties arise when the characteristics are to be in the same in all instruments in a production series. In this case a linear characteristic has the advantage of being easier and better to reproduce. The usual tolerances of the components involved have no significant influence on the linearity of the characteristics in the use of the present invention.

FIG. 4 shows a further embodiment of a compression circuit of the present invention. Compared to FIG. 1, an amplifier 17 is additionally connected in the circuit. Depending on whether terminal 16 or terminal 18 is selected as the output terminal, there results a different path of the effective characteristic. The circuit thus has a switchable characteristic.

In order to be easily able to subsequently expand the signals which have been compressed in the circuit of FIG. 4, the circuit shown in FIG. 5 can be used if terminal 18 of FIG. 4 is used as the output terminal. Compared to FIG. 2, an amplifier 19 is connected in the circuit of FIG. 5.

Figure 6:
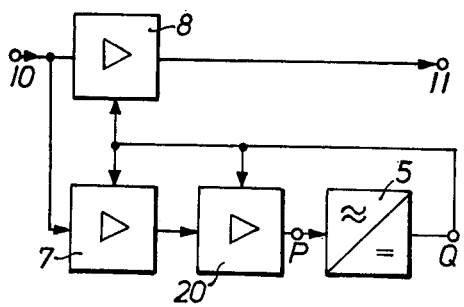

If, in the circuit of FIG. 4, terminal 16 is used as the output terminal, the circuit shown in FIG. 6 will serve as the expansion circuit, this circuit requiring an additional amplifier 20 in the branch path.

Figure 7:
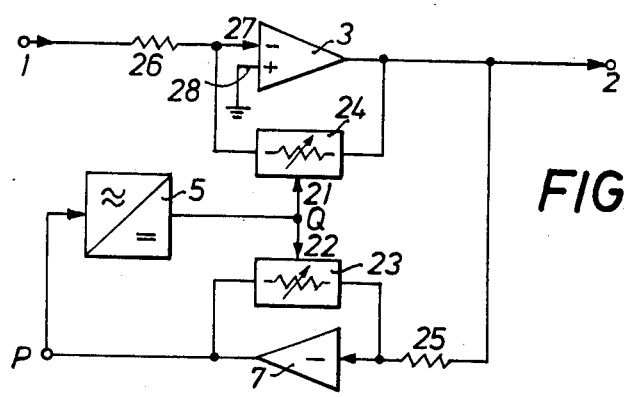
FIG. 7 is a circuit diagram of a specific forms of construction of the embodiment of FIG. 1.

FIG. 7 shows one specific embodiment of the compression circuit of FIG. 1. The amplifier 3 in the useful signal path is a differential amplifier whose inverting input 27 is connected, via a resistor 26, with the input terminal 1. The noninverting input 28 of amplifier 3 is connected to a reference voltage source, in this case ground. The differential amplifier 3 is thus connected to act as an inverting amplifier. Amplifier 3 is provided with a feedback circuit in the form of a feedback voltage divider composed of resistor 26 and an electronically controllable resistor 24. The resistance of resistor 24 can be adjusted by a control voltage Q at its control input 21. Amplifier 7 is constituted by an inverting amplifier having a feedback path provided with an electronically controllable resistor 23 whose resistance is controlled by control voltage Q applied to its control input 22. The resistor 23 forms a feedback voltage divider together with a resistor 25 connected in series with the signal input to amplifier 7.

In the above-described embodiments of the circuit of the present invention, the compression and expansion are always uniform over the entire frequency range to be transmitted. It may, however, be desirable at times to divide the frequency range of the compression circuit or of the expansion circuit into a plurality of partial ranges, as known, in which the effect in each partial frequency range is independent of the other partial ranges. This removes the so-called breathing noise occurring as a result of the dynamic regulation of useful signals at low frequencies, also known as drum rolls.

Figure 8:
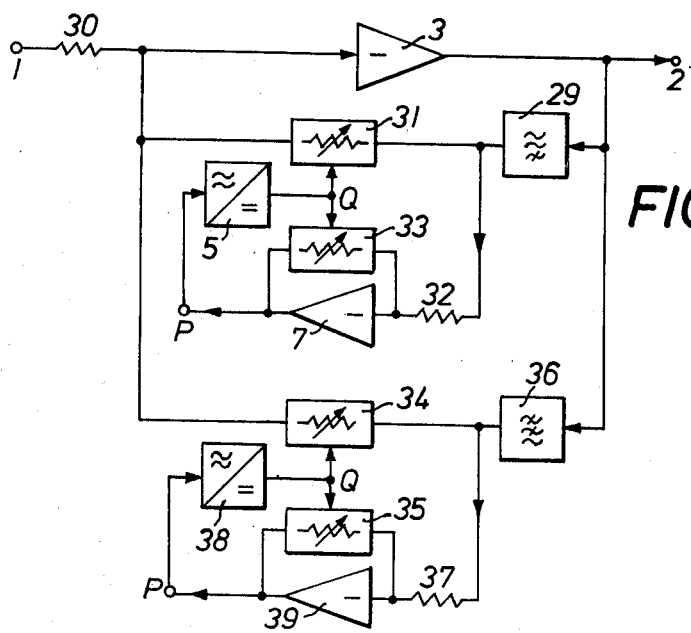
FIG. 8 is a circuit diagram of an embodiment of a compression circuit with subdivision of the frequency range.

A suitable embodiment of the present invention for a compression circuit of this type is shown in FIG. 8. The gain of amplifier 3 is controllable by controlling the feedback path 31, 30 corresponding to path 24, 26 of FIG. 7. This feedback path also includes a frequency dependent network 29. There is also provided a second feedback path 34, 30, also corresponding to feedback path 24, 26, which includes a second frequency dependent network 36.

A branch path including a controllable amplifier 7 and a control voltage generator 5 is fed, via a series resistor 32, from the point of connection between the frequency dependent network 29 and resistor 31. The gain of amplifier 7 is controlled via the electronically controllable feedback resistor 33. Resistors 32 and 33 correspond to elements 25 and 23 of FIG. 7.

The feedback path including the frequency dependent network 36, which is in the form of a frequency-selective filter, is designed to correspond to the feedback path including frequency-selective filter 29. The electronically controllable resistor 34 is controlled by the output signal from a further control voltage generator 38 which is designed to correspond to control voltage generator 5. The control voltage generator 38 itself is controlled by an inverting amplifier 39 whose gain is controlled by varying the resistance of controllable feedback resistor 35. Resistor 35 forms a feedback voltage divider together with a resistor 37 connected in series with the signal input of amplifier 39.

The gain of amplifier 3 is thus regulated almost independently in the frequency ranges determined by filters 29 and 36. In the present case, filters 29 and 36 are designed so that the one filter passes the low and medium frequencies and the other filter passes the high frequencies with preference.

Figure 9:
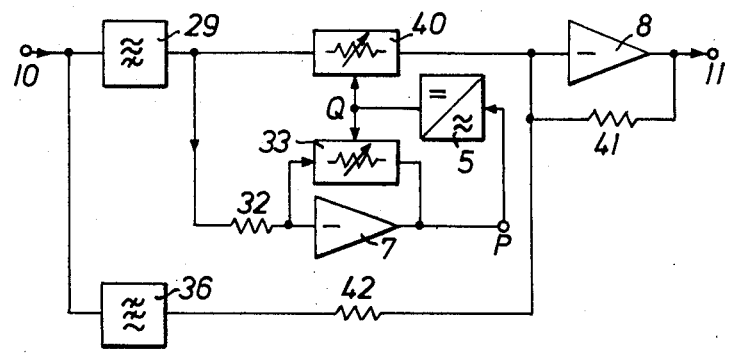
FIG. 9 is a diagram of an embodiment of an expansion circuit with subdivision of the frequency range.

The expansion circuit of FIG. 9 also effects a division of the frequency range to be transmitted into a plurality of partial ranges and is designed so that an expansion takes place only in the upper partial frequency range defined by filter 29. For this purpose a variable feedback path composed of an electronically controllable resistor 40 and a fixed resistor 41 is connected in series with filter 29. As in the compression circuit of FIG. 8, components 32, 7, 5 and 33 serve as control means. In series with a low-pass filter 36 for the lower portion of the frequency range there is a fixed feedback path composed of fixed resistors 41 and 42. This circuit, which is simpler than that of FIG. 8, is sufficient for lower quality requirements as encountered, for example, in inexpensive cassette tape recorders.

The above-described division of the frequency range can be extended as far as desired. It is merely a question of justifiable expenditures. Regarding the family of characteristics of FIG. 3, the division into a plurality of frequency ranges has the effect that the characteristics have different shapes, i.e. the position of their bends and the steepness of their slopes differ, but that the individual sections of the characteristics are again substantially linear.

For the above-described variable resistors in the feedback paths it is advantageous to employ the source-drain paths of field-effect transistors. If furthermore two controllable resistors are to be controlled in the same manner, for example resistors 23 and 24 of FIG. 7 or 33 and 40 of FIG. 9, then dual field-effect transistors, e.g. Type E 420 made by the firm Siliconix, can be used with advantage.

There now follows a description of four embodiments for the above-mentioned advantageous control voltage generator which produces the effect that the control voltage characteristic for compression, e.g. characteristic 12 in FIG. 3, and the corresponding characteristic for expansion, e.g. characteristic 14 in FIG. 3, which have been made linear by the present invention will additionally have a reliably constant slope from instrument to instrument. Moreover, a defined bend is produced at the point of transition from the lower portion of the characteristic to the center portion, or control region, so that this transition can also be easily reproduced.

This improved control voltage generator includes, as does the known diode rectifier, a capacitor which can be alternately charged and discharged. However, while in the diode rectifier the capacitor is charged by the peaks of the halfwaves of the useful signals, in the improved control voltage generator the charging is effected by the operating voltage source. The useful signals only have a controlling effect on the charge, or discharge, in that they close an electronic switch disposed in the charging, or discharging, circuit when a threshold value has been exceeded. The time constant of the charge, or discharge, can be made extremely short compared to that existing in the known diode rectifier so that the control effect, which in the case of compression is the regulating effect, is actuated momentarily, i.e. the actuation time being of the order of magnitude of the duration of a halfwave of the useful signal, so that the amplitude of the useful signal is pressed below the above-mentioned threshold value. Then the switch opens again and the subsequent discharging, or charging, takes place with a longer time constant, which is sufficiently long to assure that no distortions will occur.

The above-described process takes place periodically because after opening of the switch the amplitude of the useful signal, i.e. the next halfwave, is again controlled to the threshold value. The resulting control voltage is limited either by the charging of the capacitor to the full operating voltage, as in the case of the embodiment shown in FIG. 10, or by the complete discharging of the capacitor, as in the embodiments shown in FIGS. 11 to 13. At this value of the control voltage the characteristics 12 and 14 of FIG. 3 intersect line 15, for example at 0 in FIG. 3.

Figure 10:
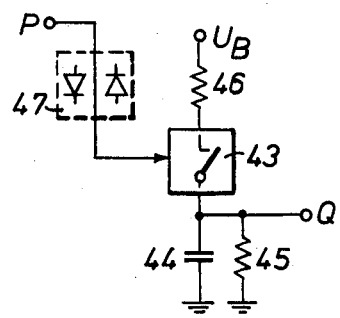
FIGS. 10 to 13 are circuit diagrams of embodiments of improved circuit voltage generators according to the invention.
Figure 11:
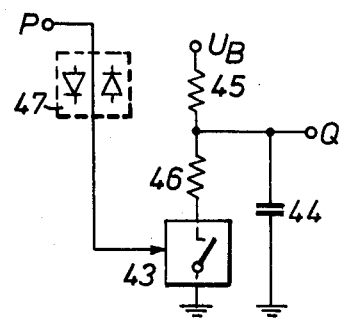
Figure 12:
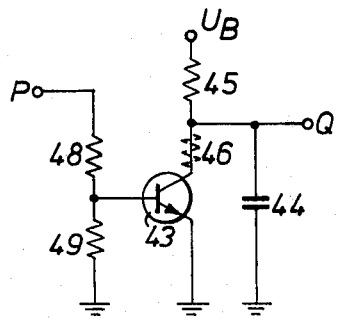
Figure 13:
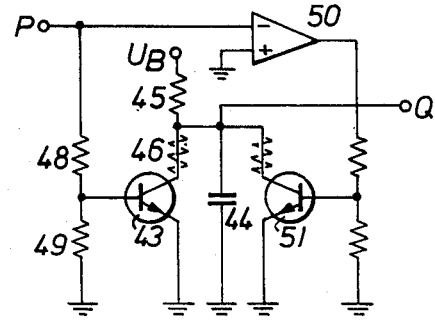

The embodiment of FIG. 10 involves the above-mentioned case in which capacitor charging occurs with a short time constant via the switch and the embodiments of FIGS. 11 to 13 involve the other case in which capacitor discharging occurs with a short time constant via the switch.

In each of FIGS. 10 – 13 the circuit for the control voltage generator, corresponding to generator 5 in FIGS. 1 through 9 and generator 38 in FIG. 8, is shown with its input terminal P and its output terminal Q.

In the circuit of FIG. 10 switch 43 is closed when the signal at point P exceeds a threshold value so that capacitor 44 is charged almost instantaneously via resistor 46, i.e. with a very short time constant the value of which is determined by components 44, 45 and 46. The threshold value may be given by the switch itself, e.g. by the base-emitter path of a transistor, or by a means connected ahead thereof, such as, for example, an amplifier. Thus a control voltage appears across the capacitor which can be tapped at point Q. Due to subsequent discharging of the capacitor via resistor 45, when switch 43 is open, this voltage drops slowly, causing the amplitude of the signal at point P to rise correspondingly until it again exceeds the threshold value so that a new charging process is initiated. It can be seen that such a control voltage generator in the control circuit in the branch path of FIG. 1 or 2, for regulation of the amplifier 7, has a very rapid regulating effect on amplifier stage 3.

This advantage is very important in this case, but such a control voltage generator also has the second significant advantage that an absolutely constant alternating voltage $U_4$ occurs at input P during compression or expansion, which is synonymous with the horizontal portion of the curve 13 of FIG. 3. This indicates that the characteristics 12 and 14 will have a constant slope in their center portion from instrument to instrument, which slope is influenced only insignificantly by the tolerances of the components of conventional size.

Characteristics 12 and 14 of FIG. 3 lie at a certain angle with respect to the dashed line 15 which corresponds to a gain of 0 dB, i.e. amplification factor of 1, if for reasons of simplicity it is assumed that amplifiers 3 and 7 of FIG. 1 and 7 and 8 of FIG. 2 are identical.

If switch 43 were capable of responding to both polarities of the applied alternating voltage, a halfwave or fullwave rectifier 47 would be placed in front of the control input to switch 43. The real resistor 46 of FIG. 10, and correspondingly also resistor 45 of FIG. 11 need not be a passive ohmic resistor, but instead, for example in a deflection circuit of a television receiver, it may be a known current source which furnishes an almost constant current.

FIG. 11 shows a circuit for the other above-mentioned case in which, after closing of switch 43 when a threshold value is being exceeded, the capacitor 44 which had previously been charged by the operating voltage via resistor 45 is discharged very rapidly through resistor 46 which has a low resistance value.

FIG. 12 shows an embodiment which operates according to the same principle as that of FIG. 11. Here it is assumed that the switch 43 is a transistor whose base is controlled by the signal voltage at point P, reduced by means of voltage divider 48, 49. When a gating voltage of, for example, 0.7 V is exceeded, the transistor becomes conductive, and, this thus determines the above-mentionend threshold value. The tolerance of the gating voltage is sufficiently close that the slope of characteristics 12 and 14 remains sufficiently constant from instrument to instrument even with demands for high quality. Transistor 43 simultaneously acts as a rectifier because only one polarity of the applied alternating voltage can unblock the transistor. If an electronic switch does not have this property, a rectifier can be connected in series ahead of the base; however, this is not necessary. Resistor 46 represents the internal resistance of transistor 43 which, if required, may be increased by an additional ohmic resistor.

FIG. 13 shows another possibility for considering the positive and negative polarities of the useful signal voltage. Each polarity here has its own associated electronic switch. The left-hand switch 43 for the positive halfwaves is the same as the switch of FIG. 12, the right-hand switch 51 with its associated components is designed in the same way and is controlled by the negative halfwaves of the useful signal via the phase reversal circuit 50, e.g. an inverting amplifier.

It will be understood that the above description of the present invention is susceptible to various modifications, changes and adaptions, and the same are intended to be comprehended within the meaning and range of equivalents of the appended claims.

I claim:

1. In a circuit for the automatic dynamic compression or expansion of a signal between its input and its output, the circuit presenting a useful signal path connected between its input and its output and containing a first variable gain member which is electronically controllable for varying the transmission factor between the circuit input and output, the circuit also presenting a branch path connected at one point to the useful signal path and containing a control voltage generator for generating, from the signal at such point in the useful signal path, a control voltage and means applying the control voltage to the variable gain member, for causing the transmission factor of the useful signal path to have a value dependent on the value of the control voltage, the improvement comprising: a second variable gain member connected in said branch path and arranged to be electronically controllable for varying the transmission factor exhibited by said branch path; and means connecting the output of said control voltage generator to said second variable gain member for effecting a counterregulation of the transmission factor of said branch path, relative to the transmission factor variation imparted to said useful signal path.

2. A circuit as defined in claim 1, wherein the transmission factor variation produced by said second variable gain member in response to control voltage variation is substantially the same as that of said first variable gain member.

3. A circuit as defined in claim 1, wherein the transmission factor variation produced by said second variable gain member in response to control voltage variation is complementary to that of said first variable gain member.

4. A circuit as defined in claim 1, wherein said first and second variable gain member constitute means for causing the dependence of the useful signal path transmission factor on the control voltage to differ by only a constant factor from the dependence of the branch path transmission factor on the control voltage.

5. A circuit as defined in claim 1, further comprising filter means connected for dividing the frequency band of the signal in at least one of said branches into partial frequency ranges, and means in said one of said branches for varying the transmission factors associated with different ones of said frequency ranges independently of one another.

6. A circuit as defined in claim 1, for effecting automatic dynamic compression, wherein the signal applied to said circuit input varies in amplitude over a range which includes a low amplitude portion and a high amplitude portion, and comprising means for causing the low amplitude portions of such signal to be increased relative to the high amplitude portions between said circuit input and output, and comprising means for limiting the extreme of the transmission factor variation relating for the low amplitudes to a selected value causing a maximal increasing of the low amplitudes.

7. A circuit as defined in claim 1, wherein said control voltage generator comprises means for producing a direct voltage constituting the control voltage and means responsive to the signal at the input to said generator for causing: the direct control voltage to be produced when the generator input signal exceeds a threshold value; the direct control voltage to vary rapidly in one amplitude direction for varying the branch path transmission factor in a direction to cause the input signal to said generator to decrease below the threshold value; and the direct control voltage to vary slowly in the opposite amplitude direction until the input signal to said generator again exceeds the threshold value.

8. A circuit as defined in claim 7, constituting a dynamic compression circuit in which the output signal in said useful signal path varies in the same manner as the input signal to said control voltage generator.

9. A circuit as defined in claim 7 wherein, in said control voltage generator, said means for producing a direct voltage comprises a capacitor and said means responsive to the signal at the generator input comprise an electronic switch connected to said capacitor and arranged to become conductive when the generator input signal exceeds the threshold value for rapidly varying the voltage across said capacitor in such one amplitude direction thus producing the control voltage across said capacitor, and voltage supply means and resistance means connected for periodically charging said capacitor under control of the operation of said switch.

* * * * *